United States Patent
Yamazaki

(10) Patent No.: US 9,090,457 B2
(45) Date of Patent: Jul. 28, 2015

(54) ELECTRONIC DEVICE

(71) Applicant: KABUSHIKI KAISHA TOSHIBA, Minato-ku, Tokyo (JP)

(72) Inventor: Hiroaki Yamazaki, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/830,451

(22) Filed: Mar. 14, 2013

(65) Prior Publication Data
US 2013/0285122 A1  Oct. 31, 2013

(30) Foreign Application Priority Data

Apr. 27, 2012  (JP) ................................. 2012-103925

(51) Int. Cl.

| | |
|---|---|
| *B81B 3/00* | (2006.01) |
| *H01L 29/40* | (2006.01) |
| *H01L 29/78* | (2006.01) |
| *H01L 27/20* | (2006.01) |
| *H01L 21/00* | (2006.01) |
| *H01L 21/44* | (2006.01) |
| *H01L 29/84* | (2006.01) |
| *B81C 1/00* | (2006.01) |
| *H01L 49/02* | (2006.01) |

(52) U.S. Cl.
CPC ........... *B81B 3/0086* (2013.01); *B81C 1/00246* (2013.01); *B81B 3/0018* (2013.01); *B81C 2203/0735* (2013.01); *B81C 2203/0771* (2013.01); *H01L 28/20* (2013.01); *H01L 29/84* (2013.01)

(58) Field of Classification Search
CPC .................. B81B 2201/047; B81B 2207/095; B81B 2207/096; B81B 2207/097; B81B 3/0018; B81B 2201/0264; B81B 2207/012; B81B 3/00; B81B 3/0051; B81B 3/0086; B81B 7/0067; B81B 7/007
See application file for complete search history.

(56) References Cited

U.S. PATENT DOCUMENTS

| | | | | |
|---|---|---|---|---|
| 6,917,459 | B2 * | 7/2005 | Nikkel et al. ................. | 359/290 |
| 7,310,175 | B2 * | 12/2007 | Monroe et al. ............. | 359/225.1 |
| 7,427,797 | B2 * | 9/2008 | Ohguro et al. ............... | 257/415 |
| 2004/0262645 | A1 * | 12/2004 | Huff et al. .................... | 257/232 |
| 2010/0328840 | A1 | 12/2010 | Yamazaki | |
| 2011/0063773 | A1 | 3/2011 | Ikehashi | |
| 2011/0063774 | A1 | 3/2011 | Ikehashi et al. | |
| 2011/0291167 | A1 * | 12/2011 | Shimooka et al. ........... | 257/296 |

FOREIGN PATENT DOCUMENTS

JP  2008-080442 A  4/2008

* cited by examiner

*Primary Examiner* — Marco D Pizarro
*Assistant Examiner* — Nelson Garces
(74) *Attorney, Agent, or Firm* — Holtz, Holtz, Goodman & Chick PC

(57) ABSTRACT

According to one embodiment, an electronic device includes a drive circuit on a semiconductor substrate, an insulating region including a first insulating part provided on the semiconductor substrate and formed of interlayer insulating films, and a second insulating part provided on the first insulating part, an element for a high-frequency provided on the insulating region and driven by the drive circuit, an interconnect including a first conductive part in the first insulating part, and a second conductive part in the second insulating part, and transmitting a drive signal from the drive circuit to the element, a first shield provided inside the insulating region and below the element, and a second shield provided inside the insulating region and below the second conductive part.

16 Claims, 4 Drawing Sheets

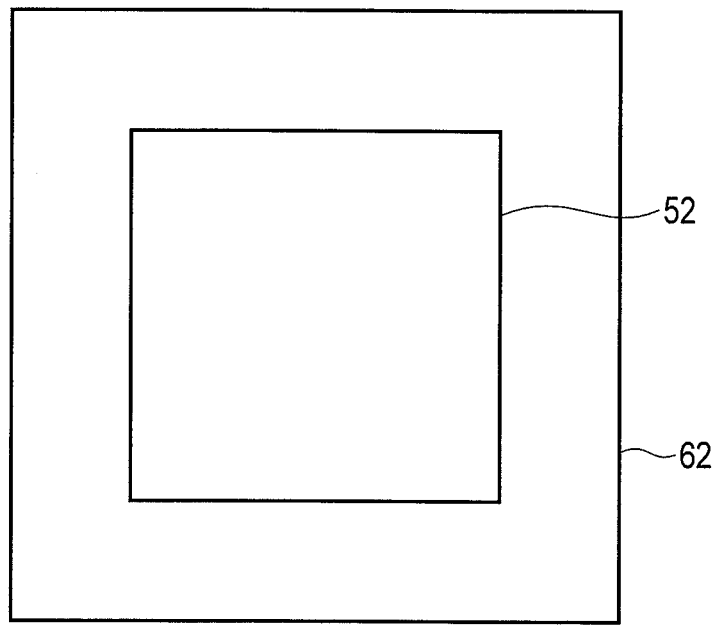
F I G. 2

US 9,090,457 B2

ELECTRONIC DEVICE

CROSS-REFERENCE TO RELATED APPLICATIONS

This application is based upon and claims the benefit of priority from Japanese Patent Application No. 2012-103925, filed Apr. 27, 2012, the entire contents of which are incorporated herein by reference.

FIELD

Embodiments described herein relate generally to an electronic device.

BACKGROUND

An electronic device in which a micro electro mechanical system (MEMS) element, and drive circuit configured to drive the MEMS element are provided on the same semiconductor substrate is proposed.

When a high-frequency application element is used as the MEMS element, a shield is provided between the MEMS element and semiconductor substrate in order to reduce an influence of a parasitic component (such as parasitic resistance, parasitic capacitance or the like) of the semiconductor substrate.

However, heretofore, it cannot be said that an influence of the parasitic component could have sufficiently been suppressed. Therefore, an electronic device capable of sufficiently suppress the influence of the parasitic component is desired.

BRIEF DESCRIPTION OF THE DRAWINGS

FIG. 2 is a view schematically showing a relationship between a pattern of a conductive part and pattern of a shield.

DETAILED DESCRIPTION

In general, according to one embodiment, an electronic device includes: a semiconductor substrate; a drive circuit provided on the semiconductor substrate; an insulating region including a first insulating part provided on the semiconductor substrate and formed of a plurality of interlayer insulating films, and a second insulating part provided on the first insulating part, the insulating region being configured to cover the drive circuit; an element for a high-frequency provided on the insulating region and driven by the drive circuit; an interconnect including a first conductive part provided in the first insulating part, and a second conductive part provided in the second insulating part, the interconnect being configured to transmit a drive signal from the drive circuit to the element; a first shield provided at a position inside the insulating region and below the element; and a second shield provided at a position inside the insulating region and below the second conductive part.

Hereinafter embodiments will be described with reference to the drawings.

Embodiment 1

Figure 1:
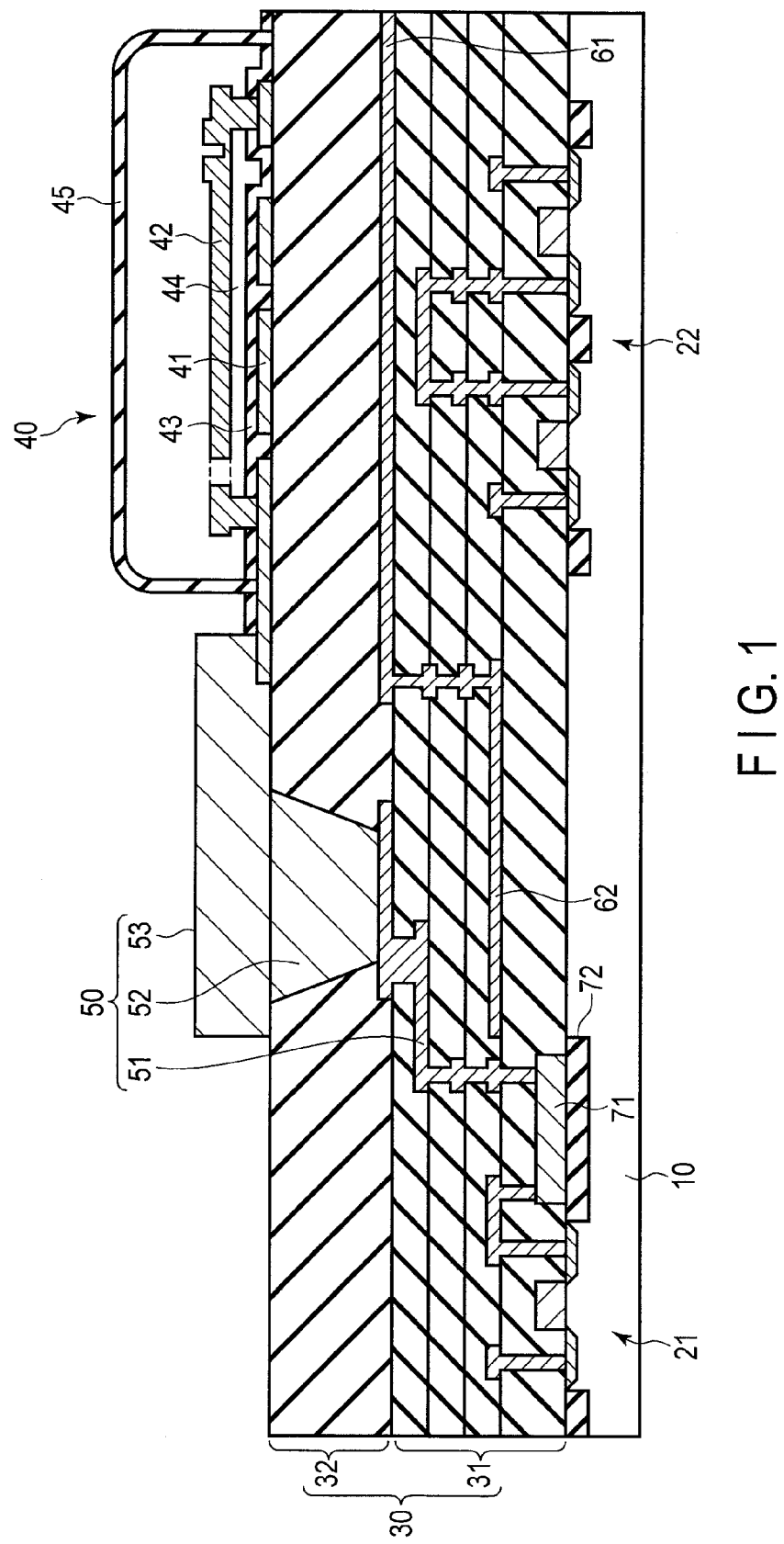
FIG. 1 is a cross-sectional view schematically showing the configuration of an electronic device according to a first embodiment.

FIG. 1 is a cross-sectional view schematically showing the configuration of an electronic device according to a first embodiment.

A semiconductor substrate 10 is a silicon substrate used for a CMOS.

A drive circuit 21 configured to drive a MEMS element 40 to be described later is provided on the semiconductor substrate 10. The drive circuit 21 is constituted of a CMOS circuit, and generates a DC voltage used to change an air gap provided in the MEMS element 40. The DC voltage generated by the drive circuit 21 has a large voltage value, and hence a comparatively large noise is generated from the drive circuit 21. Accordingly, in order to reduce the influence of the noise on the MEMS element 40, the drive circuit 21 is arranged not immediately below the MEMS element 40, but at a position somewhat apart from the MEMS element 40. Further, on the semiconductor substrate 10, a drive circuit 22 is provided. The drive circuit 22 is constituted of a CMOS circuit, and functions as a control circuit or the like for the MEMS element 40.

On the semiconductor substrate 10, an insulating region 30 covering the drive circuit 21 and drive circuit 22 is provided. The insulating region 30 includes a lower insulating part (first insulating part) 31 provided on the semiconductor substrate 10, and formed of a plurality of interlayer insulating films, and upper insulating part (second insulating part) 32 provided on the lower insulating part 31. The upper insulating part 32 is formed of a thick insulating film in order to reduce the parasitic capacitance. More specifically, the upper insulating part 32 is thicker than each of the plurality of interlayer insulating films included in the lower insulating part 31.

On the insulating region 30, the MEMS element 40 driven by the drive circuit 21 is provided. The MEMS element 40 is used as a high-frequency application variable capacitor element, and a high-frequency signal is applied thereto from outside. More specifically, the MEMS element (variable capacitor element) 40 is provided with a lower electrode 41, upper electrode 42, and dielectric layer 43 provided between the lower electrode 41 and upper electrode 42. Further, an air gap 44 is provided between the upper electrode 42, and dielectric layer 43, and the capacitance of the MEMS element 40 can be changed by changing the thickness of the air gap 44 by means of the drive circuit 21. The MEMS element main body constituted of the lower electrode 41, upper electrode 42, dielectric layer 43, and air gap 44 is covered with a protective film (dome-like film) 45.

An interconnect 50 configured to transmit a drive signal from the drive circuit 21 to the MEMS element 40 is provided between the MEMS element 40 and drive circuit 21. The interconnect 50 includes a conductive part (first conductive part) 51 provided in the lower insulating part 31, conductive part (second conductive part) 52 provided in the upper insulating part 32, and conductive part (third conductive part) 53 provided on the upper insulating part 32.

At a position inside the insulating region 30, and below the MEMS element 40, a shield (first shield) 61 formed of a metallic film is provided. More specifically, the shield 61 is provided on the lower insulating part 31. That is, the shield 61 is provided between the lower insulating part 31 and upper insulating part 32. The shield 61 is connected to the high-frequency ground (RF ground). By providing the shield 61 between the MEMS element 40 and semiconductor substrate 10, it is possible to reduce an influence of the loss component attributable to the parasitic resistance and parasitic capacitance of the semiconductor substrate 10.

At a position inside the insulating region 30, and below the conductive part 52, a shield (second shield) 62 formed of a metallic film is provided. More specifically, the shield 62 is provided in the lower insulating part 31. The shield 62 is electrically connected to the shield 61, and is connected to the high-frequency ground (RF ground). In the example shown in FIG. 1, the shield 62 is provided on the lowermost interlayer insulating film. Hereinafter, the shield 62 will be described.

Immediately below the MEMS element 40, the shield 61 is arranged, and hence it is possible to suppress the influence of the parasitic component of the part of the semiconductor substrate 10 immediately below the MEMS element 40. However, no shield is provided immediately below the conductive part 52. Accordingly, the influence of the parasitic component of the part of the semiconductor substrate 10 immediately below the conductive part 52 becomes a problem.

As already described previously, the upper insulating part 32 is formed of a thick insulating film (for example, a thickness of about 10 to 20 μm) in order to reduce the parasitic capacitance. A via hole for the conductive part 52 is formed in such a thick insulating film, and hence the size (area of the pattern of the via hole) of the via hole inevitably becomes large. For that reason, the influence of the parasitic component of the part of the semiconductor substrate 10 immediately below the conductive part 52 is not negligible. Particularly, when a substrate for the CMOS circuit is used as the semiconductor substrate 10, the influence of the parasitic component (particularly, parasitic resistance) becomes strong. By providing the shield 62 between the conductive part 52 and semiconductor substrate 10, it is possible to significantly reduce the influence of the parasitic component of the part of the semiconductor substrate 10 immediately below the conductive part 52. That is, it is possible to significantly reduce the influence of the parasitic component of the semiconductor substrate 10 on the MEMS element 40 through the conductive part 52. As a result, it is possible to obtain a MEMS element 40 having an electrically high Q value.

Here, the shield 61 is provided on the lower insulating part 31, whereas the shield 62 is provided in the lower insulating part 31. That is, the shield 62 is formed on the lower layer side of the shield 61. This is because the interconnect part connected to the conductive part 52 is provided on the lower insulating part 31, and hence the shield 62 cannot be provided on the lower insulating part 31. For that reason, the shield 62 is provided on the lower layer side of the interconnect part connected to the conductive part 52. By employing such arrangement, it is possible to form the shield 62 without contact with the interconnect 50.

FIG. 2 is a view schematically showing a relationship between a pattern of the conductive part 52 (pattern of the via hole) and pattern of the shield 62. As shown in FIG. 1 and FIG. 2, the pattern of the conductive part 52 is positioned inside the pattern of the shield 62 when the patterns are viewed from a direction perpendicular to the surface of the semiconductor substrate 10. By forming such a positional relationship between the patterns, it is possible to securely obtain a shielding effect by the shield 62. The via shape is not limited to the square, and a polygon, circle, ellipse, and the like may be employed.

Further, in order to prevent a high-frequency component from leaking from the MEMS element 40 into the drive circuit 21, a resistive element 71 used for a low-pass filter (LPF) is provided above the semiconductor substrate 10. More specifically, an element isolation region 72 is provided on the semiconductor substrate, and the resistive element 71 is provided on the element isolation region 72. It is possible to prevent the high-frequency component (RF component) of the high-frequency signal to be applied to the MEMS element 40 from leaking into the drive circuit 21 by means of the resistive element 71.

As described above, in this embodiment, the shield 62 is provided below the conductive part 52 with a large pattern area, and hence it is possible to securely suppress the influence of the parasitic component of the part of the semiconductor substrate 10 below the conductive part 52. As a result, it is possible to obtain a MEMS element in which the influence of the parasitic component through the conductive part 52 is suppressed. Further, in this embodiment, the shield 62 is provided on the lower layer side of the shield 61, and hence it is possible to securely form the shield 62 without contact with the interconnect 50.

Embodiment 2

Figure 3:
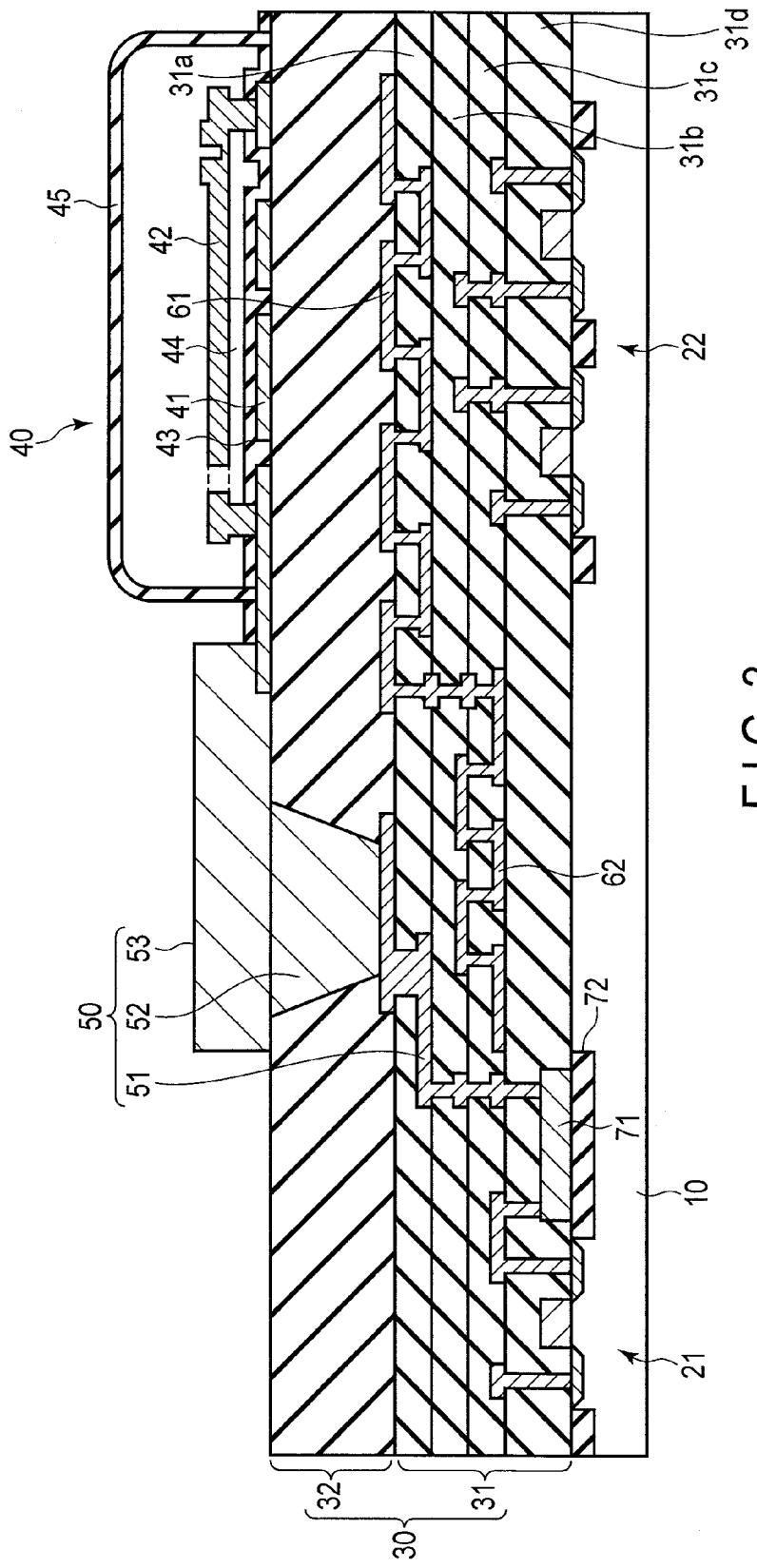
FIG. 3 is a cross-sectional view schematically showing the configuration of an electronic device according to a second embodiment.

FIG. 3 is a cross-sectional view schematically showing the configuration of an electronic device according to a second embodiment. It should be noted that the fundamental configuration is identical to the first embodiment described previously, and hence the constituent elements corresponding to the constituent elements shown in FIG. 1 are denoted by identical reference symbols, and their detailed descriptions are omitted.

In the first embodiment described above, although the whole shield 61 is formed on the same interlayer insulating film, in this embodiment, a part of a shield 61 is formed on an interlayer insulating film 31a, and the other part of the shield 61 is formed on an interlayer insulating film 31b. More specifically, the part of the shield 61 formed on the interlayer insulating film 31a is formed into a shape with slits, and the part of the shield 61 formed on the interlayer insulating film 31b is formed into a shape covering the above slits. Further, in this embodiment, a part of a shield 62 is formed on an interlayer insulating film 31c, and the other part of the shield 62 is formed on an interlayer insulating film 31d. More specifically, the part of the shield 62 formed on the interlayer insulating film 31c is formed into a shape with a slit, and the part of the shield 62 formed on the interlayer insulating film 31d is formed into a shape covering the above slit.

For example, if the shield 61 is formed of a continuous single shield film, there is a case where a problem of film exfoliation or the like occurs. In this embodiment, the part of the shield 61 formed on the interlayer insulating film 31a is constituted of a plurality of sections, and the part of the shield 61 formed on the interlayer insulating film 31b is constituted of a plurality of sections, whereby a problem of film exfoliation or the like can be prevented from occurring. Further, the part of the shield 61 formed on the interlayer insulating film 31b is formed to cover the slits of the part of the shield 61 formed on the interlayer insulating film 31a, and hence it is possible to securely obtain a shielding effect. The same is true of the shield 62.

Embodiment 3

Figure 4:
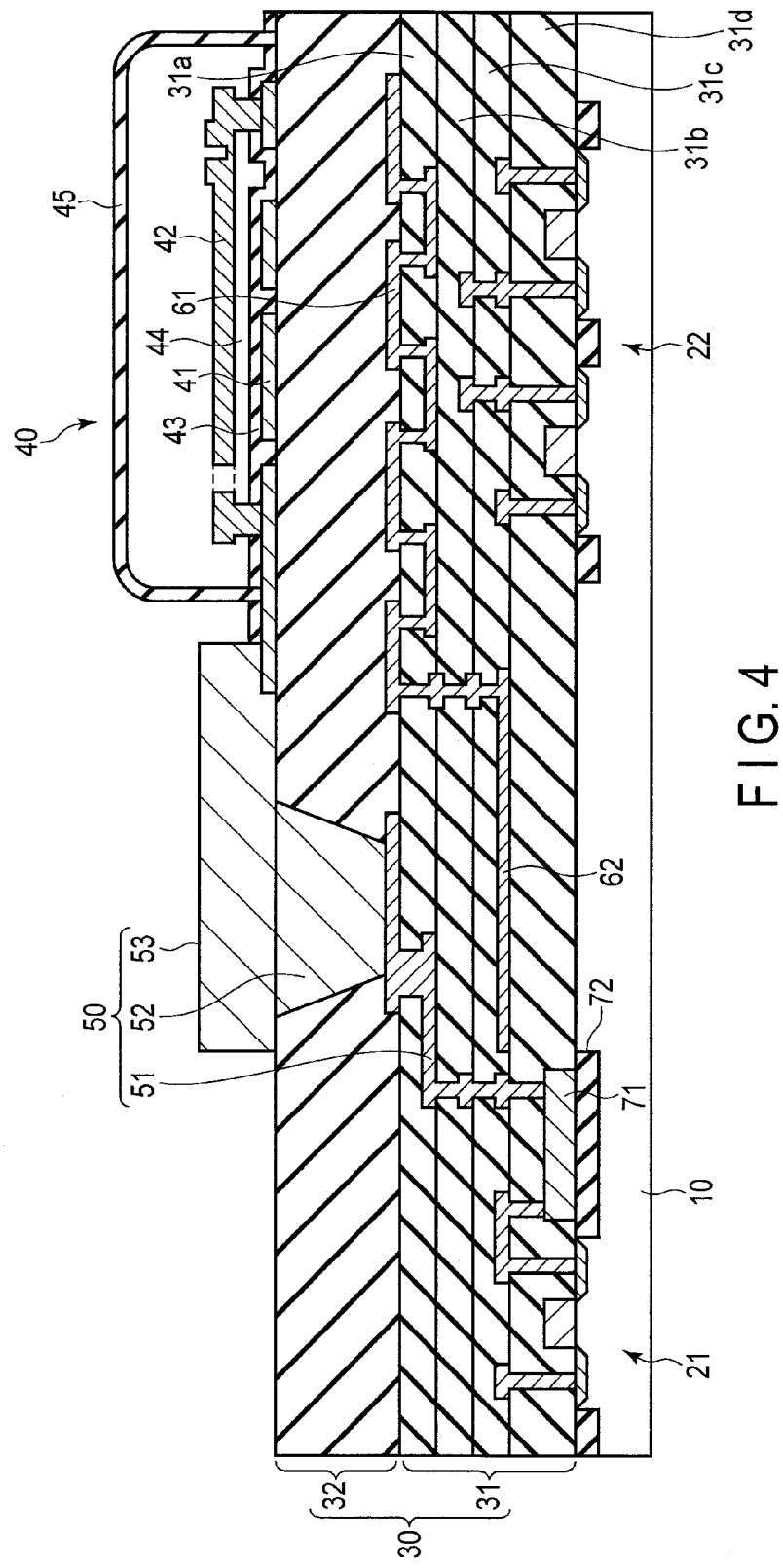
FIG. 4 is a cross-sectional view schematically showing the configuration of an electronic device according to a third embodiment.

FIG. 4 is a cross-sectional view schematically showing the configuration of an electronic device according to a third embodiment. It should be noted that the fundamental configuration is identical to the first embodiment, and second embodiment described previously, and hence the constituent elements corresponding to the constituent elements shown in FIG. 1, and FIG. 3 are denoted by identical reference symbols, and their detailed descriptions are omitted.

This embodiment employs a configuration identical to the second embodiment with respect to a shield 61, and employs a configuration identical to the first embodiment with respect to a shield 62.

Even when such configurations are used, it is possible to obtain an advantage identical to the first embodiment or the second embodiment.

It should be noted that as shown in the above-mentioned first to third embodiments, it is desirable that the shield 62 be provided on the lower layer side of the shield 61. More specifically, it is desirable that the shield 61 should at least include a part thereof provided on the lower insulating part 31. Further, it is desirable that the shield 62 be provided in the lower insulating part 31, and not be provided on the lower insulating part 31.

It should be noted that in the above-mentioned first to third embodiments, although the variable capacitor element is used as the MEMS element 40, other high-frequency application elements may be used as the MEMS element 40. Further, it is also possible to use an element other than the MEMS element as the element 40. For example, a high-frequency application inductor element may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
    a semiconductor substrate;
    a drive circuit provided on the semiconductor substrate;
    an insulating region including a first insulating part provided on the semiconductor substrate and formed of a plurality of interlayer insulating films, and a second insulating part provided on the first insulating part, the insulating region being configured to cover the drive circuit;
    an element for a high-frequency application provided on the insulating region and driven by the drive circuit;
    an interconnect including a first conductive part provided in the first insulating part, and a second conductive part provided in the second insulating part, wherein a pattern of the second conductive part is positioned outside a region in which the element is provided when viewed from a direction perpendicular to a surface of the semiconductor substrate, and wherein the interconnect is provided between the drive circuit and the element and is configured to transmit a drive signal from the drive circuit to the element;
    a first shield provided at a position inside the insulating region and below the element; and
    a second shield provided at a position inside the insulating region and below the second conductive part;
    wherein the second conductive part is provided in a via hole formed in the second insulating part; and
    wherein an entirety of the pattern of the second conductive part is positioned inside a pattern of the second shield when viewed from the direction perpendicular to the surface of the semiconductor substrate.

2. The device of claim 1, wherein the second shield is provided in the first insulating part and is not provided on the first insulating part.

3. The device of claim 2, wherein at least a part of the first shield is provided on the first insulating part.

4. The device of claim 2, wherein the second shield is provided on the lowermost one of the interlayer insulating films.

5. The device of claim 1, wherein the first shield and the second shield are electrically connected to each other.

6. The device of claim 1, wherein the second shield is connected to an RF ground.

7. The device of claim 1, wherein the second insulating part is thicker than each of the plurality of interlayer insulating films.

8. The device of claim 1, wherein the interconnect further includes a third conductive part provided on the second insulating part.

9. The device of claim 1, further comprising a resistive element provided above the semiconductor substrate and configured to prevent a high-frequency component from leaking from the element into the drive circuit.

10. The device of claim 1, wherein the element is a MEMS element.

11. The device of claim 10, wherein the MEMS element is a variable capacitor element.

12. The device of claim 1, wherein the drive circuit includes a CMOS circuit.

13. The device of claim 1, wherein the second shield includes a part thereof formed on one of the interlayer insulating films and a part thereof formed on another of the interlayer insulating films.

14. The device of claim 1, wherein the drive circuit is positioned outside the region in which the element is provided when viewed from the direction perpendicular to the surface of the semiconductor substrate.

15. The device of claim 1, wherein the element is positioned inside a pattern of the first shield when viewed from the direction perpendicular to the surface of the semiconductor substrate.

16. The device of claim 1, wherein at least a part of the first shield is provided on the first insulating part, and the first conductive part is further provided on the first insulating part.

* * * * *